(12) United States Patent
Depta et al.

(10) Patent No.: US 12,312,098 B2
(45) Date of Patent: May 27, 2025

(54) EXTERIOR AIRCRAFT LIGHT, AIRCRAFT COMPRISING AN EXTERIOR AIRCRAFT LIGHT, AND METHOD OF ASSEMBLING AN EXTERIOR AIRCRAFT LIGHT

(71) Applicant: Goodrich Lighting Systems GmbH & Co. KG, Lippstadt (DE)

(72) Inventors: Marion Depta, Lippstadt (DE); Elmar Schrewe, Anröchte (DE); Anil Kumar Jha, Lippstadt (DE)

(73) Assignee: GOODRICH LIGHTING SYSTEMS GMBH & CO. KG, Lippstadt (DE)

( * ) Notice: Subject to any disclaimer, the term of this patent is extended or adjusted under 35 U.S.C. 154(b) by 0 days.

(21) Appl. No.: 18/544,121

(22) Filed: Dec. 18, 2023

(65) Prior Publication Data
US 2024/0208671 A1 Jun. 27, 2024

(30) Foreign Application Priority Data
Dec. 21, 2022 (EP) ..................................... 22215714

(51) Int. Cl.
*B64D 47/04* (2006.01)
*F21S 41/19* (2018.01)
*H05K 1/11* (2006.01)

(52) U.S. Cl.
CPC ............ *B64D 47/04* (2013.01); *F21S 41/192* (2018.01); *B64D 2203/00* (2013.01); *H05K 1/111* (2013.01)

(58) Field of Classification Search
CPC .... B64D 47/04; B64D 47/06; B64D 2203/00; F21S 41/192; H05K 1/111
See application file for complete search history.

(56) References Cited

U.S. PATENT DOCUMENTS

| | | | |
|---|---|---|---|
| 7,314,296 B2 | 1/2008 | Machi et al. | |
| 7,434,970 B2 | 10/2008 | Machi et al. | |
| 9,209,353 B2 * | 12/2015 | Radermacher | H01L 33/08 |
| 10,773,826 B1 | 9/2020 | Lapujade et al. | |

(Continued)

FOREIGN PATENT DOCUMENTS

| | | |
|---|---|---|
| EP | 3141485 | 10/2019 |
| EP | 3205584 | 6/2020 |

OTHER PUBLICATIONS

European Patent Office; European Search Report dated May 25, 2023 in Application No. 22215714.1.

*Primary Examiner* — Tracie Y Green
*Assistant Examiner* — Michael Chiang
(74) *Attorney, Agent, or Firm* — SNELL & WILMER L.L.P.

(57) ABSTRACT

Exterior aircraft light, comprising a light source having a first electrode and a second electrode and a light source support for supporting the light source, wherein the light source support comprises conductive traces for supplying electric energy to the light source; and wherein the light source support comprises a first group of electric contact areas, which are spaced from each other and which are electrically connected with each other, and a second group of electric contact areas, which are spaced from each other and which are electrically connected with each other. The first group of electric contact areas and the second group of electric contact areas form an extended electric contact structure that allows for the light source to be positioned on the light source support in a plurality of different positions.

17 Claims, 11 Drawing Sheets

(56) References Cited

U.S. PATENT DOCUMENTS

| | | |
|---|---|---|
| 11,274,812 B2 | 3/2022 | Stange et al. |
| 2015/0369435 A1* | 12/2015 | Bauer ............... F21S 41/19 |
| | | 362/545 |
| 2017/0073083 A1* | 3/2017 | Hessling-von Heimendahl ......... |
| | | F21S 43/14 |
| 2019/0113180 A1* | 4/2019 | Dau .................. F21K 9/23 |
| 2023/0025975 A1* | 1/2023 | Feng ............ H05K 1/0295 |

* cited by examiner

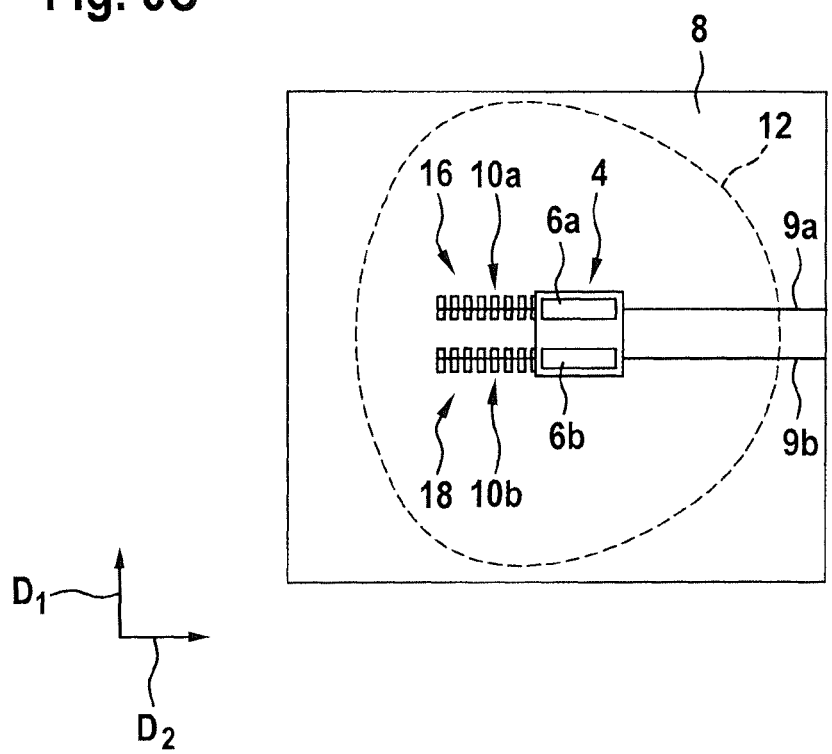

EXTERIOR AIRCRAFT LIGHT, AIRCRAFT COMPRISING AN EXTERIOR AIRCRAFT LIGHT, AND METHOD OF ASSEMBLING AN EXTERIOR AIRCRAFT LIGHT

CROSS-REFERENCE TO RELATED APPLICATIONS

This application claims priority to, and the benefit of, EP Patent Application No. 22215714.1, filed Dec. 21, 2022 and titled "EXTERIOR AIRCRAFT LIGHT, AIRCRAFT COMPRISING AN EXTERIOR AIRCRAFT LIGHT, AND METHOD OF ASSEMBLING AN EXTERIOR AIRCRAFT LIGHT," which is incorporated by reference herein in its entirety for all purposes.

FIELD

The present invention is in the field of exterior aircraft lights, such as exterior aircraft anti-collision lights and exterior aircraft forward navigation lights. The present invention also includes aircraft comprising at least one exterior aircraft light and a method of assembling an exterior aircraft light.

BACKGROUND

Almost all aircraft are equipped with aircraft lights, including exterior aircraft lights, which are installed on the outside of the aircraft, and interior aircraft lights, which are installed within the aircraft. Exterior aircraft lights may include take-off lights, taxi lights, runway turn-off lights, landing lights, logo lights, cargo loading lights, wing scan lights, engine scan lights, and search lights. Exterior aircraft lights may also include anti-collision lights, in particular white strobe anti-collision lights and red-flashing beacon lights, and navigation lights, in particular forward navigation lights and tail navigation lights.

The direction(s) and/or spatial sector(s), into which light is to be emitted from an exterior aircraft light for generating a desired light pattern, may depend on the position and/or on the orientation in which the respective exterior aircraft light is mounted to an aircraft. Since the position and/or the orientation, in which the respective exterior aircraft light is mounted to the aircraft, usually varies for different types of aircraft, different types of exterior aircraft lights with different light emission characteristics are commonly produced for different types of aircraft.

Accordingly, it would be beneficial to provide an exterior aircraft light, which allows, in the course of assembling the exterior aircraft light, for easily adjusting the light emission characteristics of the exterior aircraft light to different intended mounting positions and/or mounting orientations, in order to facilitate a comparably easy production of exterior aircraft lights that fit different types of aircraft.

SUMMARY

Exemplary embodiments of the invention include an exterior aircraft light comprising a light source and a light source support for supporting the light source. The light source has a first electrode and a second electrode. The light source support comprises a first group of electric contact areas and a second group of electric contact areas. The light source support further comprises conductive traces, which are coupled to the first group of electric contact areas and to the second group of electric contact areas, for supplying electric energy to the light source. The first group of electric contact areas are spaced from each other and they are electrically connected with each other. The second group of electric contact areas are spaced from each other and they are electrically connected with each other as well. The first group of electric contact areas and the second group of electric contact areas form an extended electric contact structure that allows for the light source to be positioned on the light source support in a plurality of different positions. The first electrode of the light source is soldered to a subset of the first group of electric contact areas and the second electrode of the light source is soldered to a subset of the second group of electric contact areas.

Exemplary embodiments of the invention further include an aircraft, such as an airplane or a rotorcraft, comprising at least one exterior aircraft light according to an exemplary embodiment of the invention.

Exemplary embodiments of the invention also include a method of assembling an exterior aircraft light, wherein the method comprises: providing a light source having a first electrode and a second electrode; providing a light source support for supporting the light source, the light source support comprising a first group of electric contact areas, which are spaced from each other and which are electrically connected with each other, and a second group of electric contact areas, which are spaced from each other and which are electrically connected with each other, the first group of electric contact areas and the second group of electric contact areas forming an extended electric contact structure. The method further includes soldering the first electrode of the light source to a subset of the first group of electric contact areas and soldering the second electrode of the light source to a subset of the second group of electric contact areas, thereby fixing the light source to the light source support at a selected position for generating a desired light output of the aircraft exterior light, when the light source is activated.

A light source support according to exemplary embodiments of the invention allows for positioning the light source in a plurality of different positions on the light source support in the course of assembling the exterior aircraft light and for supplying electric energy to the light source via the conductive traces and the electric contact areas for operating the light source. The electric energy may be supplied to the light source in operation, irrespective of which of the plurality of different positions on the light source support the light source has. The light source may be said to have the same electric coupling to the light source support and, thus, to the conductive traces, despite the different positions on the light source support/on the extended electric contact structure.

As a result, exterior aircraft lights that generate different light outputs in operation may be manufactured from the same components, and the respectively desired light output may be set in the course of assembling the respective exterior aircraft light by selecting the position of the light source on the light source support from the plurality of different potential positions, made possible by the plurality of electric contact areas. Exterior aircraft lights, which are suitable to be mounted to different types of aircraft, may be manufactured efficiently and at low costs. As all exterior aircraft lights may be manufactured from the same components, the certification of the exterior aircraft lights may be simplified as well.

In an embodiment, each of the subsets of the first and second groups of electric contact areas may comprise a plurality of electric contact areas, which are selected from the respective group of electric contact areas. Using a plurality of electric contact areas per electrode may provide for a particularly reliable electric connection between the light source and the electric contact areas and, thus, the conductive traces. Each subset may in particular comprise a number of electric contact areas which is smaller than the number of electric contact areas comprised in the respective group. In other words, each subset does not comprise all electric contact areas of the respective group of electric contact areas. Since each subset does not comprise all electric contact areas of the respective group of electric contact areas, different positions of the light source on the light source support may be set in the course of assembling the exterior aircraft light, namely by selecting different subsets of electric contact areas for mounting the electrodes of the light source.

In an embodiment, at least one of the subsets of the first and second groups of electric contact areas comprises only a single electric contact area. By using only a single electric contact area, the coupling of the electrode(s) of the light source to the electric contact areas, provided on the light source support, may be carried out with a particularly high degree of flexibility, which may yield particularly high flexibility in positioning the light source.

In an embodiment, the electric contact areas of the first group are electrically connected with each other within the light source support or on a back side of the light source support and/or the electric contact areas of the second group are electrically connected with each other within the light source support or on the back side of the light source support. The electric contact areas of the first group and/or the electric contact areas of second group may in particular be electrically connected with each other by conductive traces, which are formed within the light source support and/or on the back side of the light source support. The back side of the light source support is the side of the light source support opposite to the front side of the light source support, i.e. opposite to the side of the light source support on which the electric contact areas are formed and the light source is provided. Conductive traces may be formed comparably easy on the back side of the light source support. Conductive traces formed within the light source support may be well-protected from adverse external influences, as they are embedded in and enclosed by the material of the light source support. The electric connections between the electric contact areas of the first group/between the electric contact areas of the second group are different from the conductive traces for supplying electric energy to the light source.

The first and second groups of electric contact areas are not electrically connected to each other by conductive traces formed within or on the light source support. In consequence, the first and second groups of electric contact areas may be electrically connected to two poles of an electric power supply for supplying electric power to the light source for operating the same.

In an embodiment, the electric contact areas of the first group are arranged in a first row of electric contact areas; and the electric contact areas of the second group are arranged in a second row of electric contact areas. The first row of electric contact areas and the second row of electric contact areas may be arranged side-by-side. The first row of electric contact areas and the second row of electric contact areas may in particular extend in a linear manner, substantially parallel to each other.

An embodiment, in which the electric contact areas of the first and second groups are arranged in a first row and a second row of electric contact areas, allows for adjusting the light output, generated by the exterior aircraft light, by selecting the position of the light source along the first and second rows of electric contact areas. A convenient adjusting of the desired light output during assembly of the exterior aircraft light may be provided via the provision of only one degree of freedom along the first and second rows of electric contact areas.

Within each of the first and second groups, adjacent electric contact areas of the first group and adjacent electric contact areas of the second group may be spaced from each other by a distance in the range of between 0.1 mm and 0.3 mm, in particular by a distance in the range of between 0.1 mm and 0.2 mm.

In an embodiment, the electric contact areas of the first group are arranged in a first two-dimensional matrix pattern of electric contact areas, and/or the electric contact areas of the second group are arranged in a second two-dimensional matrix pattern of electric contact areas. Each matrix pattern may by a rectangular matrix pattern. The first two-dimensional matrix pattern of electric contact areas and the second two-dimensional matrix pattern of electric contact areas may be arranged side-by-side.

An embodiment, in which the electric contact areas of at least one group of electric contact areas are arranged in a two-dimensional matrix pattern, may allow for providing reliable electric contacts for different types of light sources, in particular for light sources in which the electrodes are arranged at different distances from each other. In consequence, light sources having different dimensions may be employed and conveniently and reliably placed on the extended electric contact structure in such an embodiment. While one dimension of the two-dimensional matrix pattern may allow for varying the position of the light source for adjusting the light output of the exterior aircraft light, as it has been described before, the additional dimension of the two-dimensional matrix pattern may allow for contacting the electrodes of different types of light sources, where the electrodes have different distances from each other along said second dimension. As a result, the light source of the exterior aircraft light may be selected from a larger selection of light sources.

An exterior aircraft light in which the electric contact areas of at least one group are arranged in a two-dimensional matrix pattern may further be particularly suitable for using new light sources, which may become available in the future, where the distance between the electrodes differs from the distance between the electrodes of currently available light sources.

In each two-dimensional matrix pattern, adjacent electric contact areas may be spaced from each other by a distance in the range of between 0.1 mm and 0.3 mm, in particular by a distance in the range of between 0.1 mm and 0.2 mm.

In an embodiment, the electric contact areas of the first group and/or the electric contact areas of the second group are stripe-shaped. The stripe-shaped electric contact areas of the first group and/or the stripe-shaped electric contact areas of the second group may in particular extend parallel to each other. Employing stripe-shaped electric contact areas may allow for providing electric contact areas with enlarged surface structures that are available for electric coupling. For example, soldering electrodes of the light sources to the stripe-shaped electric contact areas may be achieved in a particularly effective manner. Also, comparably large surface areas may be provided, while it is possible to keep the pitch between the stripe-shaped electric contact areas small and the positioning flexibility for the light source high. Large electric contact areas may also allow for supplying large electric currents via the electric contact areas to the light sources, without running into thermal issues. Soldering the electrodes to large electric contact areas may further enhance the mechanical stability of the coupling between the electrodes of the light source and the electric contact areas.

The stripe-shaped electric contact areas of the first group and/or the electric contact areas of the second group may have a length, i.e. an extension in a longitudinal direction, in the range of between 5 mm and 10 mm.

The stripe-shaped electric contact areas of the first group and/or the stripe-shaped electric contact areas of the second group may have a width, i.e. an extension in a transverse direction, in the range of between 0.1 mm and 0.3 mm, in particular in the range of between 0.1 mm and 0.2 mm.

In an embodiment, the first group of electric contact areas and/or the second group of electric contact areas have substantially the same extension in a first direction and in a second direction, with the second direction being oriented orthogonal to the first direction. The electric contact areas of the first group and/or of the second group may in particular be square-shaped or circular. Electric contact areas that have substantially the same extension in the first direction and in the second direction are comparably easy to produce. They are also very suitable for being arranged in a two-dimensional matrix pattern, in particular in a rectangular two-dimensional matrix pattern.

The extension of the electric contact areas of the first group and/or the extension of the electric contact areas of the second group may be in the range of between 0.1 mm and 0.3 mm, in particular in the range of between 0.1 mm and 0.2 mm, in the first direction and in the second direction.

In an embodiment, the electric contact areas of the first group and the electric contact areas of the second group are provided as solder pads for allowing the first and second electrodes of the light source to be soldered to the electric contact areas. Soldering the electrodes of the light source to the electric contact areas may provide for a strong mechanical coupling between the light source and the electric contact areas of the light source support. Soldering may further provide for an electric coupling having a low electric resistance, which in turn may allow for efficiently supplying electric energy to the light source via the electrodes and the electric contact areas.

In an embodiment, the light source comprises an LED, the light source may in particular be an LED. LEDs are light sources that have a high efficiency, a high reliability, and a long lifetime at reasonable costs. For a high light intensity of the light emitted by the exterior aircraft light, the light source may also comprise a plurality of LEDs, which may be connected in series or in parallel with each other. The exterior aircraft light may also comprise a plurality of light sources, in particular a plurality of LEDs, which may be arranged next to each other on the light source support and which may be electrically connected in parallel to the electric contact areas.

In an embodiment, the exterior aircraft light further comprises at least one optical element, which is arranged over the light source for shaping a light output of the exterior aircraft light. In such an embodiment, the light emitted by the light source contributes differently to the light output of the exterior aircraft light for the plurality of different positions of the light source on the light source support. The at least one optical element may in particular be arranged in a predefined position on the light source support, irrespective of where the light source is positioned on the extended electric contact structure. The at least one optical element may be said to be arranged such that light from the light source contributes differently to the light output of the exterior aircraft light for the plurality of different positions of the light source on the light source support. The at least one optical element may allow for shaping the light output of the exterior aircraft light according to the respective functionality of the exterior aircraft light. It may in particular allow for emitting the light into a predefined spatial sector, which extends from the exterior aircraft light and which may have a predefined opening angle in a horizontal and/or in a vertical plane.

A method of assembling an exterior aircraft light according to an exemplary embodiment of the invention may include arranging at least one optical element over the light source and fixing the at least one optical element to the light source in a predefined position. Said position may be independent of the position of the light source.

The at least one optical element may comprise one or more lenses and/or one or more reflectors and/or one or more shutters for shaping a light output of the exterior aircraft light. In case the exterior aircraft light comprises a plurality of light sources, at least one optical element may be assigned individually to each of the plurality of light sources. The exterior aircraft light may also comprise at least one optical element that is configured and arranged for affecting the light emission of a plurality, in particular of all of the light sources.

The plurality of light sources may also be grouped into a plurality of groups of light sources. The light sources of each group may be arranged next to each other and/or the light sources of each group may provide the same functionality. At least one optical element may be assigned to each group of light sources for affecting the light emission of the light sources of said group.

In an embodiment, the plurality of different positions on the light source support include a position in which the light source is positioned in a focal point of the optical element. The plurality of different positions on the light source support further include at least one position in which the light source is not positioned in a focal point of the optical element.

In an embodiment, the light output of the exterior aircraft light has a main light emission direction; a first angle between the main light emission direction and the plane of the light source support, which is measured when the light source is arranged at a first end region of the first and second groups of electric contact areas, differs from a second angle between the main light emission direction and the plane of the light source support, which is measured when the light source is arranged at a second end region of the first and second groups of electric contact areas, by between 20° and 30°. In other words, the first and second groups of electric contact areas and the at least one optical element are configured such that the main light emission direction of the exterior aircraft light may be changed over an angular range of between 20° and 30°, in particular over an angular range of about 25°, by selecting the position of the light source on the plurality of electric contact areas. For the plurality of different positions of the light source, the main light emission direction may be measured in the same plane orthogonal to the light source support.

In an embodiment, the exterior aircraft light is a wing-mounted exterior aircraft light, in particular a wing-mounted forward navigation light. The light output of the wing-mounted exterior aircraft light is limited by an inner boundary, which is oriented at a cut-off angle with respect to the plane of the light source support. When the wing-mounted exterior aircraft light is mounted to the wing of an aircraft, the inner boundary delimits the light output, generated by the wing-mounted exterior aircraft light, on the side facing the fuselage of the aircraft. The inner boundary may in particular the forward flight direction of the aircraft. A first cut-off angle, which is present when the light source is arranged at a first end region of the first and second groups of electric contact areas, may differ from a second cut-off angle, which is present when the light source is arranged at a second end region of the first and second groups of electric contact areas, by between 20° and 30°, in particular by about 25°.

This may allow for manufacturing the wing-mounted exterior aircraft light according to its intended mounting position on an aircraft. In the course of assembly, the wing-mounted exterior aircraft light may in particular be adjusted to different angles of the wing, to which the wing-mounted exterior aircraft light is intended to be mounted, with respect to a longitudinal axis of the aircraft/ with respect to the fuselage of the aircraft. This may allow for generating a desired light output of the wing-mounted exterior aircraft light, when it has been mounted to the aircraft, for different angles of the wing with respect to the longitudinal axis/with respect to the fuselage of the aircraft. In consequence, a wing-mounted exterior aircraft light according to an exemplary embodiment of the invention may be mounted to different types of aircraft, in particular to different types of aircraft that have the wings oriented at different angles with respect to the longitudinal axis or fuselage of the aircraft. The adaptation of the desired light output may be carried out by an according selection of the position of the light source, while keeping other components of the exterior aircraft light, such as the housing, the light source support, the at least one optical element, and the light transmissive cover the same.

When the exterior aircraft light is a wing-mounted exterior aircraft light, in particular a wing-mounted forward navigation light, a method of assembling the exterior aircraft light according to an exemplary embodiment of the invention may include determining a wing angle of the aircraft wing, to which the wing-mounted exterior aircraft light is to be mounted, with respect to the fuselage of the aircraft/with respect to a longitudinal axis of the aircraft; and selecting the position of the light source on the plurality of electric contact areas, provided on the light source support, as a function of the determined wing angle.

In an embodiment, the wing angle is determined at the position of the wing-mounted forward navigation light on the wing. The wing angle may in particular be the angle of a front edge of the wing, i.e. of the wing front edge, with respect to the longitudinal axis of the aircraft.

The method may further include determining an angle between the light source support and the front edge of the wing and additionally taking this angle into account, when determining the position of the light source on the light source support. In this way, a potentially tilted orientation of the light source support with respect to the front edge of the wing, when the exterior aircraft light is mounted to the wing, may be taken into account.

In an embodiment, the exterior aircraft light comprises a plurality of light sources and a plurality of first groups of electric contact areas and a plurality of second groups of electric contact areas. Each light source may have a respective first electrode and a respective second electrode. The electric contact areas of each first group may be spaced from each other and they may be electrically connected with each other. Similarly, the electric contact areas of each second group may be spaced from each other and they may be electrically connected with each other.

A respective first group of electric contact areas and a respective second group of electric contact areas may form a respective extended electric contact structure that allows for a respective light source to be positioned on the light source support in a plurality of different positions. The first electrode of the respective light source may be soldered to a respective subset of the respective first group of electric contact areas, and the second electrode of the respective light source may be soldered to a respective subset of the respective second group of electric contact areas.

Such an embodiment may allow for enhancing the intensity of light, emitted by the exterior aircraft light, by providing and operating a plurality of light sources. Providing a plurality of light sources and a plurality of first and second groups of electric contact areas may further allow for combining a plurality of functionalities in a single exterior aircraft light. Such a combined exterior aircraft light may, for example, comprise at least one white light source for providing the functionality of a white strobe anti-collision light and at least one red or green light source for providing the functionality of a forward navigation light. Alternative or additional functionalities may be integrated into an exterior aircraft light by providing further light sources and further first and second groups of electric contact areas.

In an embodiment, the exterior aircraft light is a forward navigation light, which is configured for emitting red or green light.

In an embodiment, the exterior aircraft light is a white strobe anti-collision light or a red-flashing beacon light.

In an embodiment, the exterior aircraft light is a landing light or a take-off light.

In an embodiment, the exterior aircraft light is a multi-function light that provides the functionalities of at least two or all of a forward navigation light and a white strobe anti-collision light and a red-flashing beacon light.

In an embodiment, the exterior aircraft light is a multi-function light that provides the functionalities of a landing light and of a take-off light.

BRIEF DESCRIPTION OF THE DRAWINGS

FIGS. 6A to 6C depict schematic top views of the three different configurations of an exterior aircraft light shown in FIGS. 4A to 4C and FIGS. 5A to 5C;

DETAILED DESCRIPTION

Figure 1:
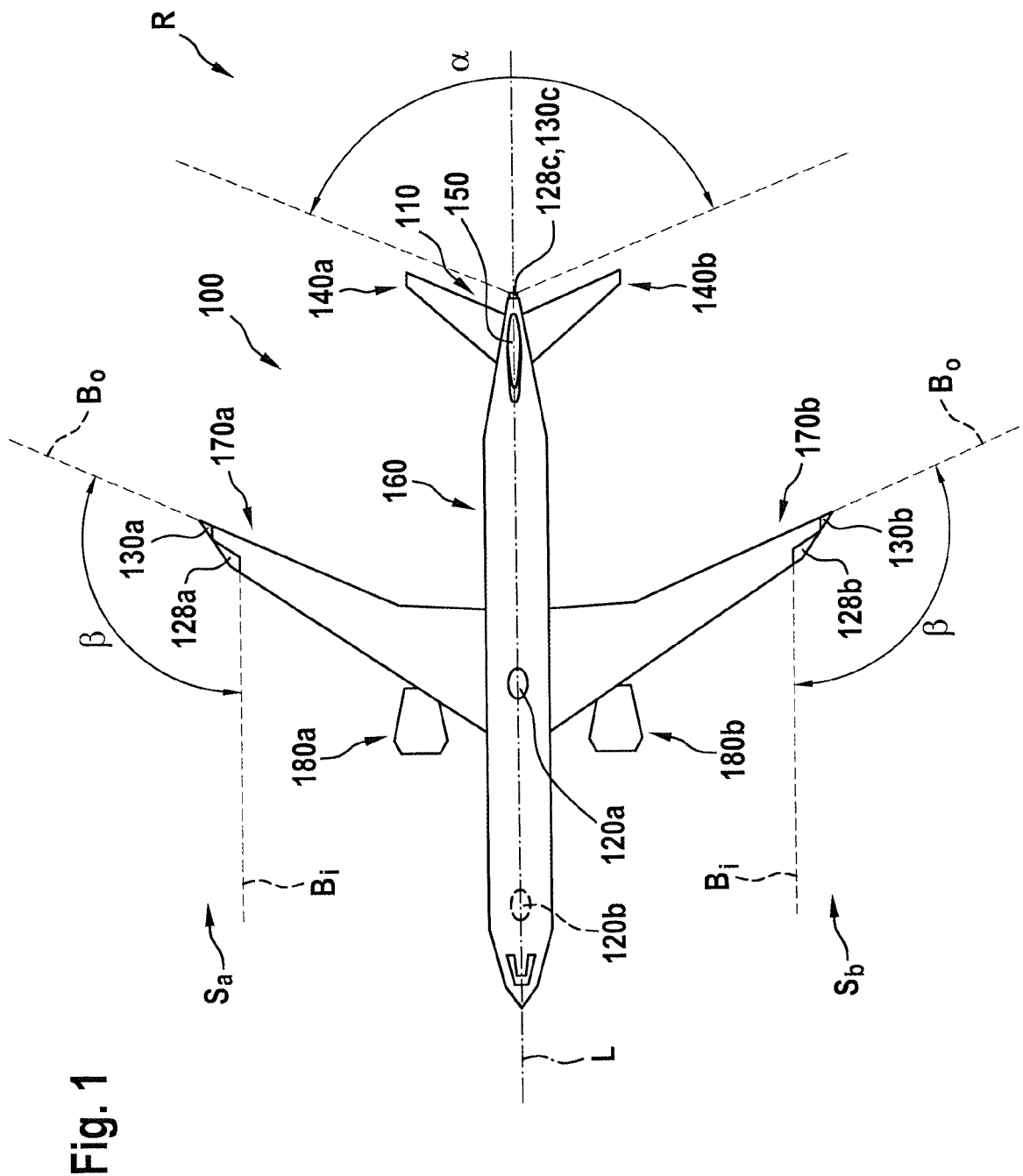
FIG. 1 depicts a schematic top view of an aircraft according to an exemplary embodiment of the invention, which is equipped with multiple exterior aircraft lights according to exemplary embodiments of the invention.
Figure 2:
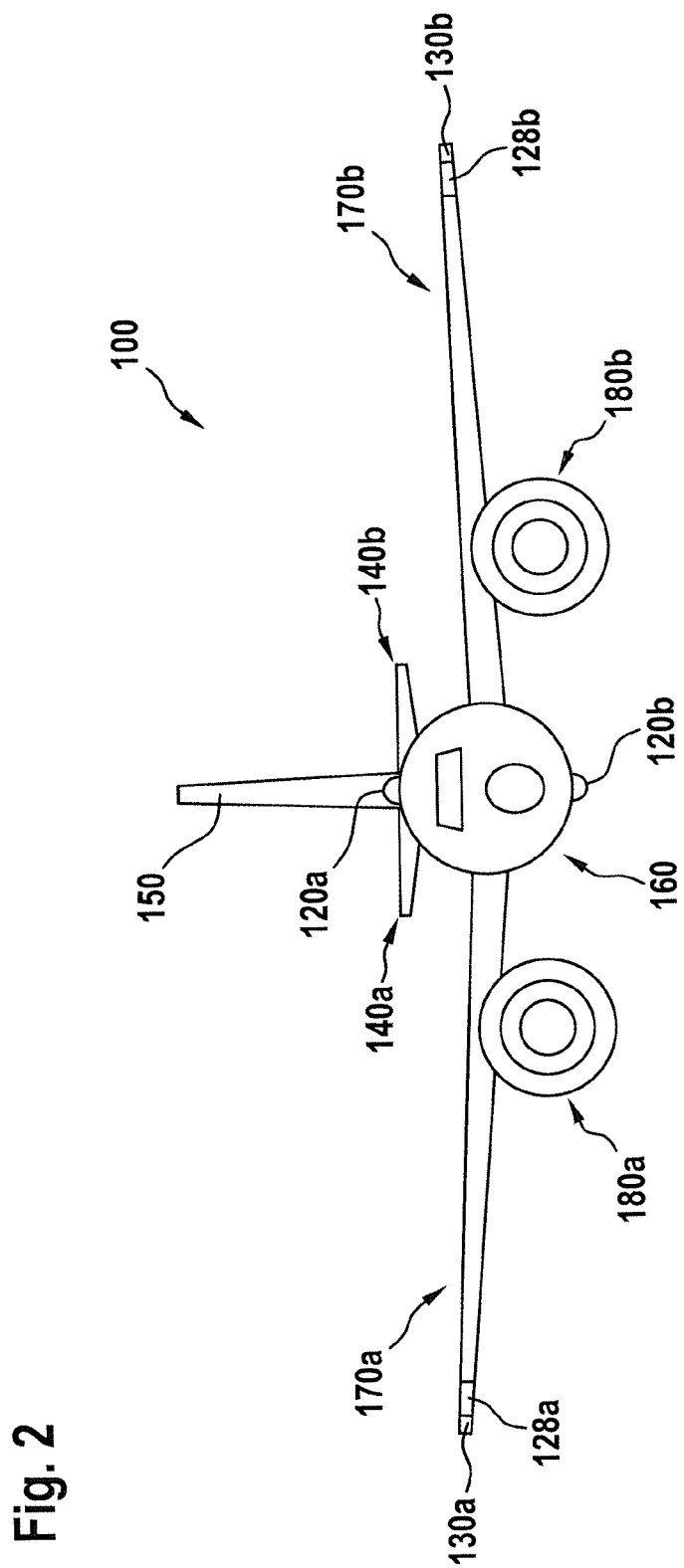
FIG. 2 depicts a schematic front view of the aircraft shown in FIG. 1.

FIG. 1 depicts a schematic top view of an aircraft 100, in particular of a passenger airplane 100, according to an exemplary embodiment of the invention from a position above the aircraft 100. FIG. 2 shows a schematic front view of the aircraft 100.

The aircraft 100 comprises a fuselage 160, extending in a longitudinal direction L, and two wings 170a, 170b, extending laterally from the fuselage 160. A respective engine 180a, 180b is attached to each of the wings 170a, 170b. The aircraft 100 further comprises two horizontal stabilizers 140a, 140b and a vertical stabilizer 150, which are mounted to an aft section of the fuselage 160.

The aircraft 100 is equipped with a variety of exterior aircraft lights.

In particular, the aircraft 100 comprises in particular three white strobe anti-collision lights 128a, 128b, 128c, two forward navigation lights 130a, 130b, one tail navigation light 130c, and two red-flashing beacon lights 120a, 120b.

An upper red-flashing beacon light 120a is installed in an upper portion of the aircraft 100, in particular on top of the fuselage 160. In an alternative configuration, the upper red-flashing beacon light 120a may be installed in an upper portion of the vertical stabilizer 150, in particular on top of the vertical stabilizer 150. A lower red-flashing beacon light 120b is installed in a lower portion of the aircraft 100. The lower red-flashing beacon light 120b may in particular be mounted to the bottom of the fuselage 160. The red-flashing beacon lights 120a, 120b emit respective sequences of red light flashes during operation.

Although only one lower red-flashing beacon light 120b is depicted in FIGS. 1 and 2, the aircraft 100 may comprise two or more lower red-flashing beacon lights 120b, which may be installed at different positions along the longitudinal extension of the fuselage 160. A first lower red-flashing beacon light may, for example, be mounted to a front portion of the fuselage 160 close to the front gear (not shown) of the aircraft 100, and a second lower red-flashing beacon light may, for example, be mounted to a middle portion of the fuselage 160 close to the main gear (not shown) of the aircraft 100 and/or to an aft portion of the fuselage below the horizontal and vertical stabilizers 140a, 140b, 150.

In alternative configurations, red-flashing beacon lights may be installed at the tips of the wings 170a, 170b and at the tail 110 of the aircraft 100, potentially supplemented by red-flashing beacon lights on the side walls of the fuselage 160 and/or on the bottom of the fuselage 160.

First and second white strobe anti-collision lights 128a, 128b are installed in the wings 170a, 170b, in particular in the respective tips of the wings 170a, 170b. A third white strobe anti-collision light 128c is installed at the tail 110 of the aircraft 100.

The white strobe anti-collision lights 128a-128c emit respective sequences of white light flashes during normal operation of the aircraft 100. It is also possible that the white strobe anti-collision lights 128a-128c are only operated during the night and in bad weather conditions.

A starboard forward navigation light 130a, which is configured for continuously emitting green light, is installed in the starboard side wing 170a, in particular in the tip of the starboard side wing 170a. A portside forward navigation light 130b, which is configured for continuously emitting red light, is installed in the portside wing 170b, in particular in the tip of the portside wing 170b. A tail navigation light 130c is installed at the tail 110 of the aircraft 100.

The aircraft 100 may be equipped with additional exterior lights, which may in particular include at least one of landing lights, take-off lights, taxi lights, runway turn-off lights, logo lights, wing scan lights, engine scan lights, and/or cargo loading lights. For clarity and simplicity of the illustration and description, these additional types of exterior lights are not depicted in the figures.

The third white strobe anti-collision light 128c and the tail navigation light 130c, which are installed at the tail 110 of the aircraft 100, are configured for emitting light into a rear spatial sector R that may have, when projected onto a horizontal plane, an opening angle $\alpha$ of approximately 140° and that may be centered with respect to a longitudinal axis L of the aircraft 100. In other words, when projected onto the horizontal plane, the rear spatial sector may extend from an angle of approximately −70° to an angle of approximately +70° with respect to the longitudinal axis L.

The first and second white strobe anti-collision lights 128a, 128b and the forward navigation lights 130a, 130b, which are located in the wings 170a, 170b of the aircraft 100, are configured for emitting light into lateral spatial sectors Sa, Sb that may have, when projected onto the horizontal plane, an opening angle $\beta$ of approximately 110°. An inner boundary Bi of each lateral spatial sector Sa, Sb, which delimits the respective lateral spatial sector Sa, Sb on the side facing the fuselage 160 of the aircraft 100, may extend substantially parallel to the longitudinal direction L of the aircraft 100. An outer boundary Bo of each of the lateral spatial sectors Sa, Sb may extend in a lateral rearward direction, having an angle of 110° with respect to the inner boundary Bi of the respective lateral spatial sector Sa, Sb.

For emitting the light into the desired lateral spatial sectors Sa, Sb, the first and second white strobe anti-collision lights 128a, 128b and the forward navigation lights 130a, 130b are adjusted to the mounting position and orientation of the respective light 128a, 128b, 130a, 130b, when mounted to the aircraft 100. In particular, in case the first and second white strobe anti-collision lights 128a, 128b and the for-ward navigation lights 130a, 130b are mounted to the tips of the wings 170a, 170b of the aircraft 100, as it is depicted in FIGS. 1 and 2, the lights 128a, 128b, 130a, 130b are adjusted to the spatial orientation of the wings 170a, 170b with respect to the longitudinal direction L of the aircraft 100, in order to emit the light into the de-sired lateral spatial sectors Sa, Sb.

Figure 3:
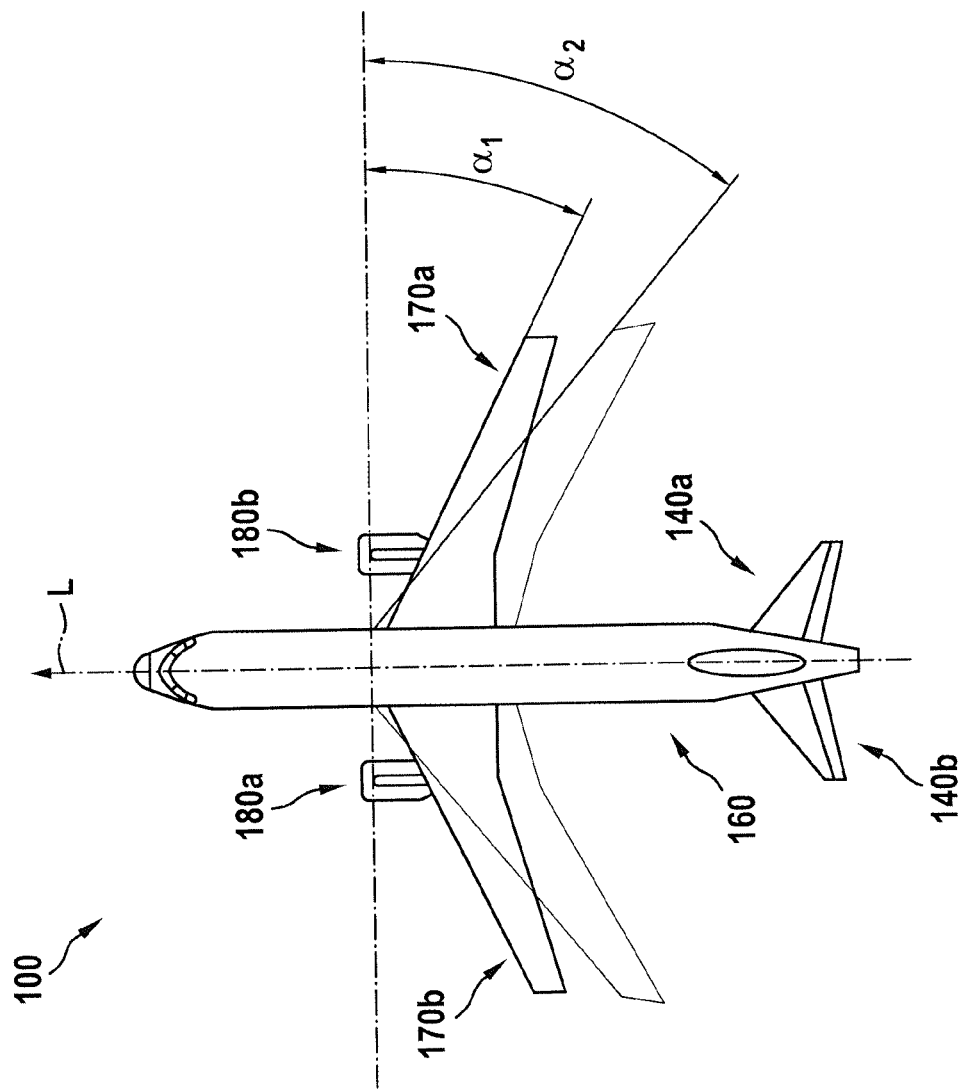
FIG. 3 depicts two aircraft with different spatial orientations of the wings with respect to the longitudinal direction of the aircraft in an overlaid schematic top view.

FIG. 3 illustrates two different aircraft 100, which are drawn in the same figure on top of each other, in a schematic top view. The two aircraft 100 differ in the spatial orientation of the wings 170a, 170b with respect to the longitudinal direction L of the aircraft 100. In other words, the wings 170a, 170b of the two aircraft, depicted in FIG. 3, are oriented at different angles $\alpha 1$, $\alpha 2$ with respect to the longitudinal direction L of the aircraft 100.

In consequence, for generating the desired light outputs into the predefined lateral spatial sectors Sa, Sb, different types of first and second white strobe anti-collision lights 128a, 128b and different types of forward navigation lights 130a, 130b are to be mounted to the wings 170a, 170b of the aircraft 100. Thus, different types of first and second white strobe anti-collision lights 128a, 128b and different types of forward navigation lights 130a, 130b are produced for the different types of aircraft 100.

It would be beneficial to reduce the production complexity of exterior aircraft lights, in particular the production complexity of white strobe anti-collision lights 128a, 128b and forward navigation lights 130a, 130b. In particular, it would be beneficial to provide a framework that allows for efficiently producing exterior aircraft lights 128a, 128b, 130a, 130b that may be mounted to different types of aircraft 100. Further in particular, it would be beneficial to provide a framework that allows for efficiently producing exterior aircraft lights 128a, 128b, 130a, 130b that may be mounted to different types of aircraft 100 in which the wings 170a, 170b are oriented at different angles with respect to the longitudinal axis L of the aircraft 100.

Figure 4A:
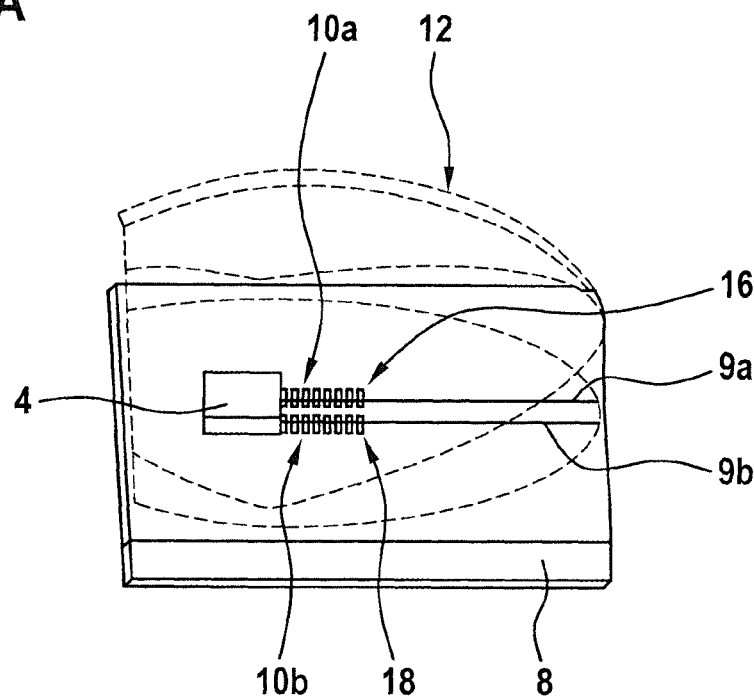
FIGS. 4A to 4C depict schematic perspective views of three different configurations of an exterior aircraft light according to an exemplary embodiment of the invention.
Figure 4B:
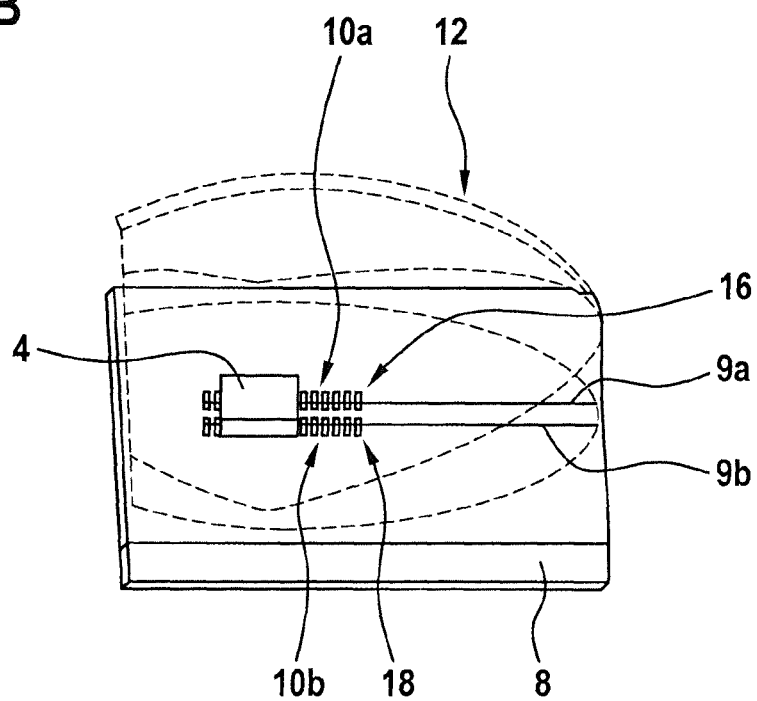
Figure 4C:
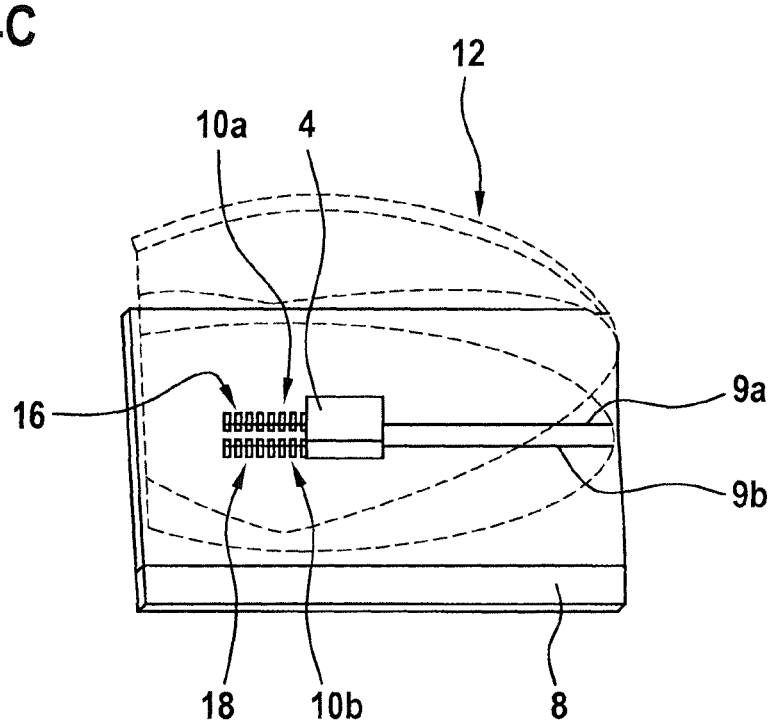
Figure 5A:
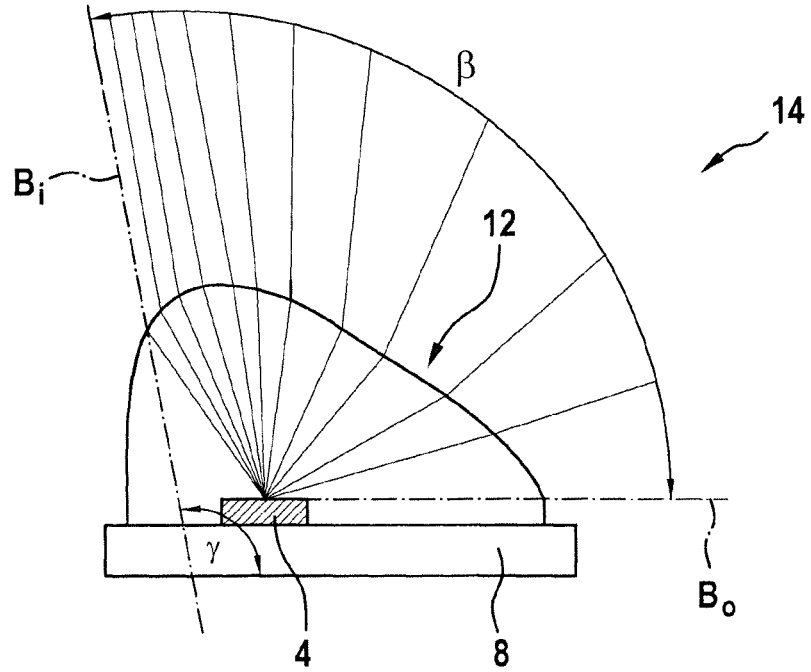
FIGS. 5A to 5C depict schematic cross-sectional views of the three different configurations of an exterior aircraft light shown in FIGS. 4A to 4C.
Figure 5B:
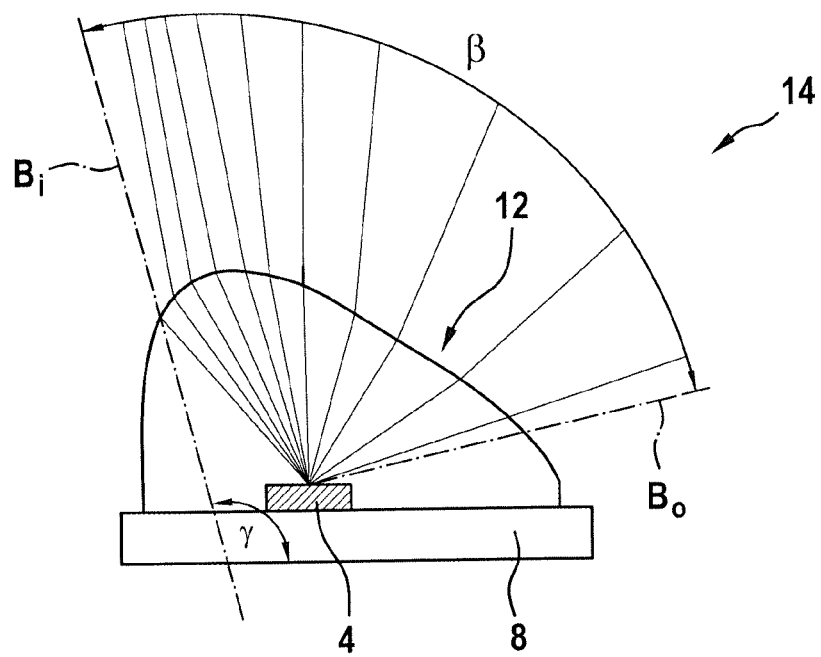
Figure 5C:
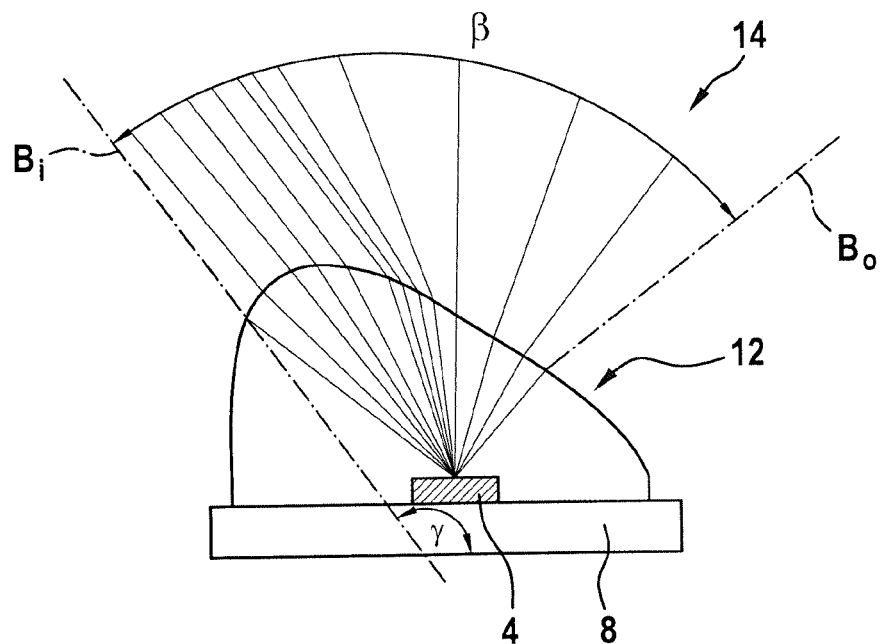
Figure 6A:
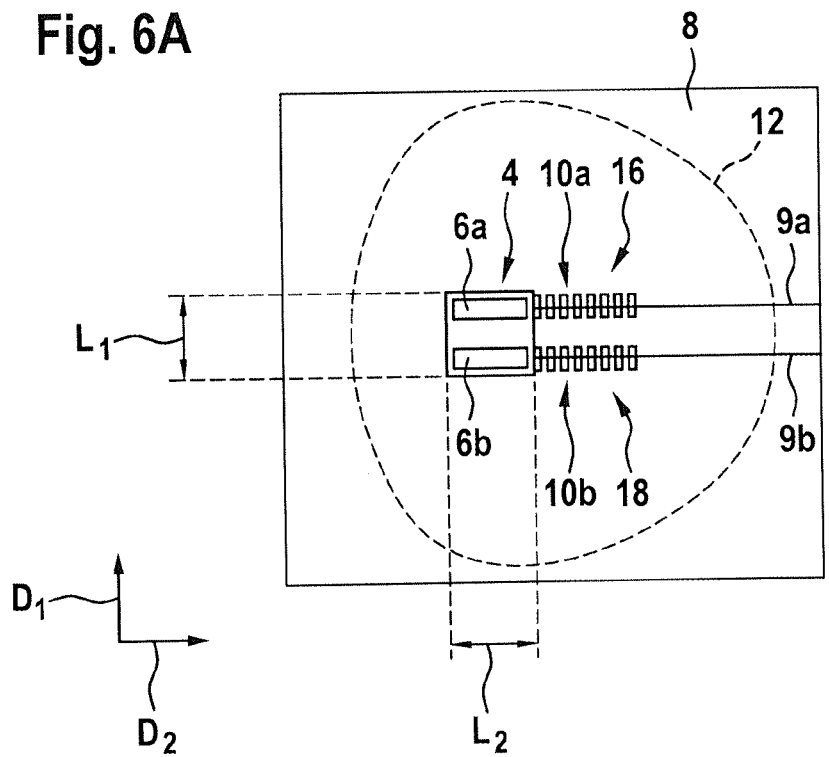
Figure 6B:
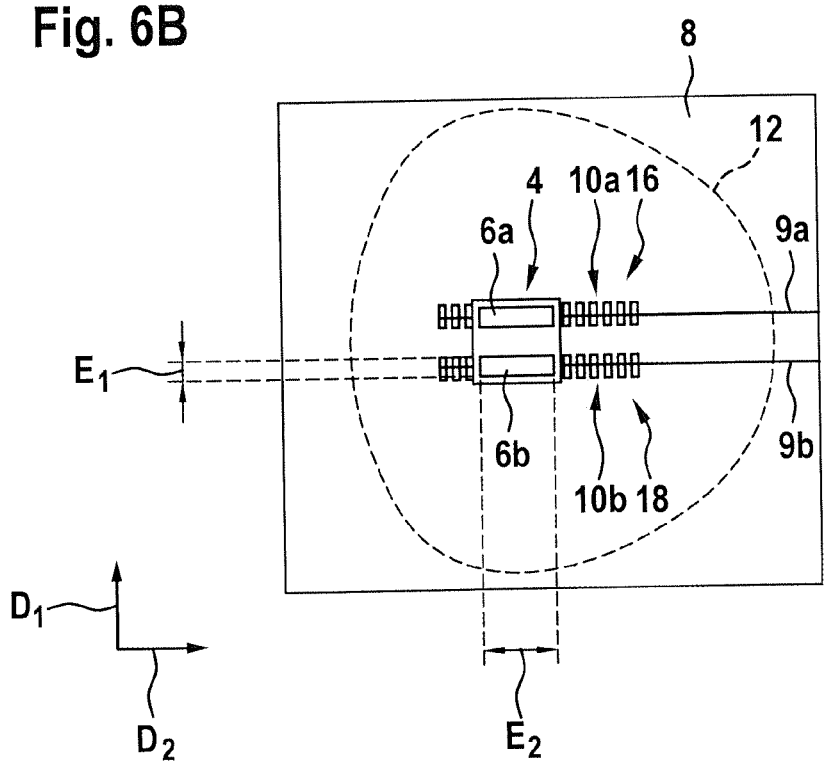

FIGS. 4A to 4C depict schematic perspective views of three different configurations of an exterior aircraft light 2 according to an exemplary embodiment of the invention. FIGS. 5A to 5C depict corresponding schematic cross-sectional views of the three different configurations, and FIGS. 6A to 6C depict schematic top views of the three different configurations.

The exterior aircraft light 2 may be configured to be mounted to one of the wings 170a, 170b of an aircraft 100, for example as a white strobe anti-collision light 128a, 128b or as a forward navigation light 130a, 130b, as it is depicted in FIGS. 1 and 2.

The exterior aircraft light 2 comprises a light source 4 having a first electrode 6a and a second electrode 6b for electrically coupling the light source 4 to a power supply. The light source 4 may in particular be an LED. The light source 4 may be configured for emitting white light, for emitting red light or for emitting green light.

The exterior aircraft light 2 further comprises a light source support 8 for supporting the light source 4 and for electrically contacting the first and second electrodes 6a, 6b of the light source 4. The light source support 8 may be a circuit board, in particular a printed circuit board (PCB).

The light source support 8 comprises a plurality of conductive traces 9a, 9b for supplying electric energy to the light source 4. The conductive traces 9a, 9b may in particular be coupled to an electric power supply, which is not shown in the figures, for supplying electric energy from the electric power supply to the light source 4 for operating the light source 4.

The light source support 8 comprises a plurality of electric contact areas 10a, 10b for electrically contacting the first and second electrodes 6a, 6b of the light source 4. The electric contact areas 10a, 10b are electrically coupled to the conductive traces 9a, 9b for providing electrically conductive couplings between the electrodes 6a, 6b of the light source 4 and the conductive traces 9a, 9b.

The electric contact areas 10a, 10b may be provided as solder pads, which allow for soldering the at least two electric electrodes 6a, 6b of the at least one light source 4 to the electric contact areas 10a, 10b.

The electric contact areas 10a, 10b allow for mounting and electrically coupling the light source 4 in different positions to the light source support 8. Details of the electric contact areas 10a, 10b will be discussed further below.

The exterior aircraft light 2 also comprises an optical element 12 for shaping a light output 14 of the exterior aircraft light 2 from the light emitted by the light source 4. In the embodiment depicted in FIGS. 4A to 6C, the optical element 12 is a lens, which is arranged over the light source 4 and which is supported by the light source support 8.

Alternatively or in addition to a lens, the optical element 12 may comprise at least one reflector (not shown) for reflecting light that is emitted by the light source 4 into a desired direction/into desired directions. The optical element 12 may also comprise at least one shutter (not shown) for blocking a selected portion of the light emitted by the light source 4.

As best visible when comparing FIGS. 5A to 5C, the characteristics of the light output 14 of the exterior aircraft light 2 depend on the position of the light source 4 with respect to the optical element 12. In other words, for each of the different positions of the light source 4 on the light source support 8, the light, which is emitted from the light source 4, contributes differently to the light output 14 of the exterior aircraft light 2.

In the embodiment depicted in FIGS. 5A to 5C, the opening angle β of the light output 14, when projected onto a horizontal plane, such as the drawing plane of FIGS. 5A to 5C, is about 110° for every position of the light source 4. It is under-stood that the opening angle β may also be somewhat different for the different positions of the light source 4. Also, it is understood that the opening angle β may be defined with respect to an absolute or relative threshold value. For example, the opening angle β may be defined as the set of directions where the light intensity is more than 10% of the peak light intensity. In another example, the opening angle β may be defined as the set of directions where the light intensity is above 5 cd for a forward navigation light. The depicted opening angles β of FIGS. 5A to 5C are in-tended to be mainly illustrative for enhancing the understanding of the general working principle of different positions for the light source 4.

On the inner side of the exterior aircraft light 2, which is the side of the exterior aircraft light 2 facing the fuselage 160 of the aircraft 100, when the exterior aircraft light 2 is mounted to a wing 170a, 170b of the aircraft 100, the light output 14 is de-limited by an inner boundary Bi. The inner boundaries may also be defined as a cut-off angle γ with respect to the light source support 8. Again, the cut-off angle γ may be defined in terms of an absolute or relative light intensity threshold value. The cut-off angle γ may be set by selecting the position of the light source 4 on the light source support 8. Setting a suitable cut-off angle γ may in particular be important in the case of a forward navigation light 130a, 130b, in order to prevent the emission of red light from a portside navigation light 130a to the starboard side of the aircraft 100, and to prevent the emission of green light from a starboard side navigation light 130a to the portside of the aircraft 100 (cf. FIG. 1).

Exterior aircraft lights 2 that emit different light outputs 14, in particular different light outputs 14 having inner boundaries Bi that are oriented at different cut-off angles γ with respect to the light source support 8, may be produced using the same light sources 4, the same light source supports 8 and the same optical elements 12, namely by selecting the position of the light source 4 on the electric contact areas 10a, 10b appropriately. Such exterior aircraft lights 2 may be produced comparably easily for different types of aircraft 100, since their light outputs 14 may be adjusted to the positions and orientations at the wings 170a, 170b of different types of aircraft 100 by selecting the position of the light source 4 on the electric contact areas 10a, 10b appropriately, when assembling the respective exterior aircraft light 2.

As a result, exterior aircraft lights 2, which are suitable to be mounted to different types of aircraft 100, may be manufactured efficiently and at low costs. The certification of such exterior aircraft lights 2 may be simplified as well.

The light source support 8 comprises a first group 16 of electric contact areas 10a, 10b. The electric contact areas 10a of the first group 16 are spaced from each other and are electrically connected with each other.

The light source support 8 further comprises a second group 18 of electric contact areas 10b. The electric contact areas 10b of the second group 18 are spaced from each other and are electrically connected with each other.

The contact areas 10a of the first group 16 and the contact areas 10b of the second group 18 may be respectively connected with each other by conductive traces formed within the light source support 8 and/or by conductive traces formed on a back side of the light source support 8. The conductive traces, provided for connecting the contact areas 10a/contact areas 10b to each other, may be extensions of the conductive traces 9a, 9b, described above for the supply of electric energy to the light source 4, or may be separate conductive traces. The back side of the light source support 8 is the side of the light source support 8 opposite to the front side of the light source support 8, on which the electric contact areas 10a, 10b are formed and the light source 4 and the optical element 12 are provided.

The light source support 8 does not comprise any connections or conductive traces 9a, 9b that electrically couple the electric contact areas 10a of the first group 16 with the electric contact areas 10b of the second group 18.

In the embodiment depicted in FIGS. 4A to 4C, 5A to 5C, and 6A to 6C, the electric contact areas 10a, 10b of the first and second groups 16, 18 are stripe-shaped.

The stripe-shaped electric contact areas 10a of the first group 16 are oriented parallel to each other extending in a first direction D1, which is a vertical direction in the orientation of the light source support 8 depicted in FIGS. 5A to 5C. The stripe-shaped electric contact areas 10b of the second group 18 are also oriented parallel to each other extending in the first direction D1.

The electric contact areas 10a of the first group 16 are arranged in a first row of electric contact areas 10a, and the electric contact areas 10b of the second group 18 are arranged in a second row of electric contact areas 10b.

The first row of electric contact areas 10a and the second row of electric contact areas 10b are arranged side-by-side, with the two rows in particular extending substantially parallel to each other along a second ("horizontal") direction D2, which is oriented orthogonal to the first direction D1.

The extension b of each of the electric contact areas 10a, 10b in the first direction D1 may be the range of between 3 mm and 12 mm, in particular in the range of between 5 mm and 10 mm. The extension a of each of the electric contact areas 10a, 10b in the second direction D2 may be in the range of between 0.1 mm and 0.3 mm, in particular in the range of between 0.1 mm and 0.2 mm.

The distance d between adjacent electric contact areas 10a, 10b along the second direction D2 may be the range of between 0.1 mm and 0.3 mm, in particular in the range of between 0.1 mm and 0.2 mm.

The light source 4 may, for example, have an extension L1 of between 0.25 mm and 1.5 mm along the first direction D1, and the light source 4 may have an extension L2 of between 0.25 mm and 1.5 mm along the second direction D2.

Each of the electrodes 6a, 6b may, for example, have an extension E1 of between 0.125 mm and 0.25 mm along the first direction D1, and each of the electrodes 6a, 6b may have an extension E2 of between 0.2 mm and 0.5 mm along the second direction D2.

The extension of the first and second groups 16, 18 of electric contact areas 10a, 10b in the second direction D2 is larger than the extension of the light source 4 in said second direction D2. In consequence, as shown in FIGS. 4A to 4C and 6A to 6C, the light source 4 may be positioned in different positions on the first and second groups 16, 18 of electric contact areas 10a, 10b along the second direction D2.

In a first configuration, which is depicted in FIGS. 4A, 5A, and 6A, the light source 4 is arranged in a left end region of the first and second groups 16, 18 of electric contact areas 10a, 10b. The first electrode 6a of the light source 4 is electrically coupled, in particular soldered, to a subset of the electric contact areas 10a of the first group 16 of electric contact areas 10a, 10b, and the second electrode 6b of the light source 4 is electrically coupled, in particular soldered, to a subset of the electric contact areas 10b of the second group 18 of electric contact areas 10a, 10b.

The light source 4 may be operated by applying an electric voltage U or providing an electric current to the electric contact areas 10a of the first group 16 and the electric contact areas 10b of the second group 18.

When the light source 4 is arranged in the left end region, the exterior aircraft light 2 emits a light output 14 as it is depicted in FIG. 5A.

In a second configuration, which is depicted in FIGS. 4C, 5C, and 6C, the light source 4 is arranged in a right end region of the first and second groups 16, 18 of electric contact areas 10a, 10b. Again, a first electrode 6a of the light source 4 is electrically coupled, in particular soldered, to a subset of the electric contact areas 10a of the first group 16 of electric contact areas 10a, 10b, and a second electrode 6b of the light source 4 is electrically coupled, in particular soldered, to a subset of the electric contact areas 10b of the second group 18 of electric contact areas 10a, 10b.

When the light source 4 is arranged in the right end region, the exterior aircraft light 2 emits a light output 14 as it is depicted in FIG. 5C.

In a third configuration, which is depicted in FIGS. 4B, 5B, and 6B, the light source 4 is arranged in a central position between the left end region and the right end region of the first and second groups 16, 18 of electric contact areas 10a, 10b. Again, a first electrode 6a of the light source 4 is electrically coupled, in particularly soldered, to a subset of the electric contact areas 10a of the first group 16 of electric contact areas 10a, 10b, and a second electrode 6b of the light source 4 is electrically coupled, in particularly soldered, to a subset of the electric contact areas 10b of the second group 18 of electric contact areas 10a, 10b.

When the light source 4 is arranged in the central position, the exterior aircraft light 2 emits a light output 14 as it is depicted in FIG. 5B.

As illustrated in the embodiment schematically depicted in FIGS. 4A to 4C, 5A to 5C, 6A to 6C, when assembling an exterior aircraft light 2 according to an exemplary embodiment of the invention, the cut-off angle γ of the light output 14, as emitted by the exterior aircraft light 2 in operation, may be adjusted to different mounting positions and/or to different mounting orientations of the exterior aircraft light 2 by selecting the position of the light source 4 on the light source support 8 and by electrically coupling the electrodes 6a, 6b of the light source 4 to selected electric con-tact areas 10a, 10b of the first and second groups 16, 18 of electric contact areas 10a, 10b, which are provided on the light source support 8.

In the first configuration, which is depicted in FIGS. 4A, 5A, and 6A, the light source 4 may, for example, be shifted to the left by 0.2 mm to 0.6 mm, in particular by 0.4 mm, with respect to the central position, which is depicted in FIGS. 4B, 5B, and 6B.

In the second configuration, which is depicted in FIGS. 4C, 5C, and 6C, the light source 4 may, for example, be shifted to the right by 1.2 mm to 1.4 mm, in particular by 1.2 mm from the central position, which is depicted in FIGS. 4B, 5B, and 6B.

The values given for the shift are, however, only exemplary. The size of the shift of the light source 4 may vary depending on the geometry of the exterior aircraft light 2, on the properties of the at least one optical element 12 of the exterior aircraft light 2, and/or on the geometry of the types of aircraft 100, to which the exterior aircraft light 2 is to be mounted.

In an alternative embodiment, which is not explicitly shown in the figures, the light source 4 may be equipped with more than two electrodes 6a, 6b. The light source 4 may in particular comprise a plurality of first electrodes 6a, which are electrically contacted, in particularly soldered, to a subset of electric contact areas 10a of the first group 16 of electric contact areas 10a, 10b, and a plurality of second electrodes 6b, which are electrically contacted, in particularly soldered, to a subset of contact areas 10b of the second group 18 of electric contact areas 10a, 10b.

Providing and electrically coupling a plurality of electrodes 6a, 6b to the electric contact areas 10a, 10b may allow for distributing the electric current I, flowing through the light source 4, over a plurality of electrodes 6a, 6b and electric contact areas 10a, 10b. In consequence, the electric load on each electrode 6a, 6b may be reduced. Providing and electrically coupling a plurality of electrodes 6a, 6b to corresponding electric contact areas 10a, 10b may further increase the mechanical stability of the coupling between the light source 4 and the light source support 8.

Figure 7:
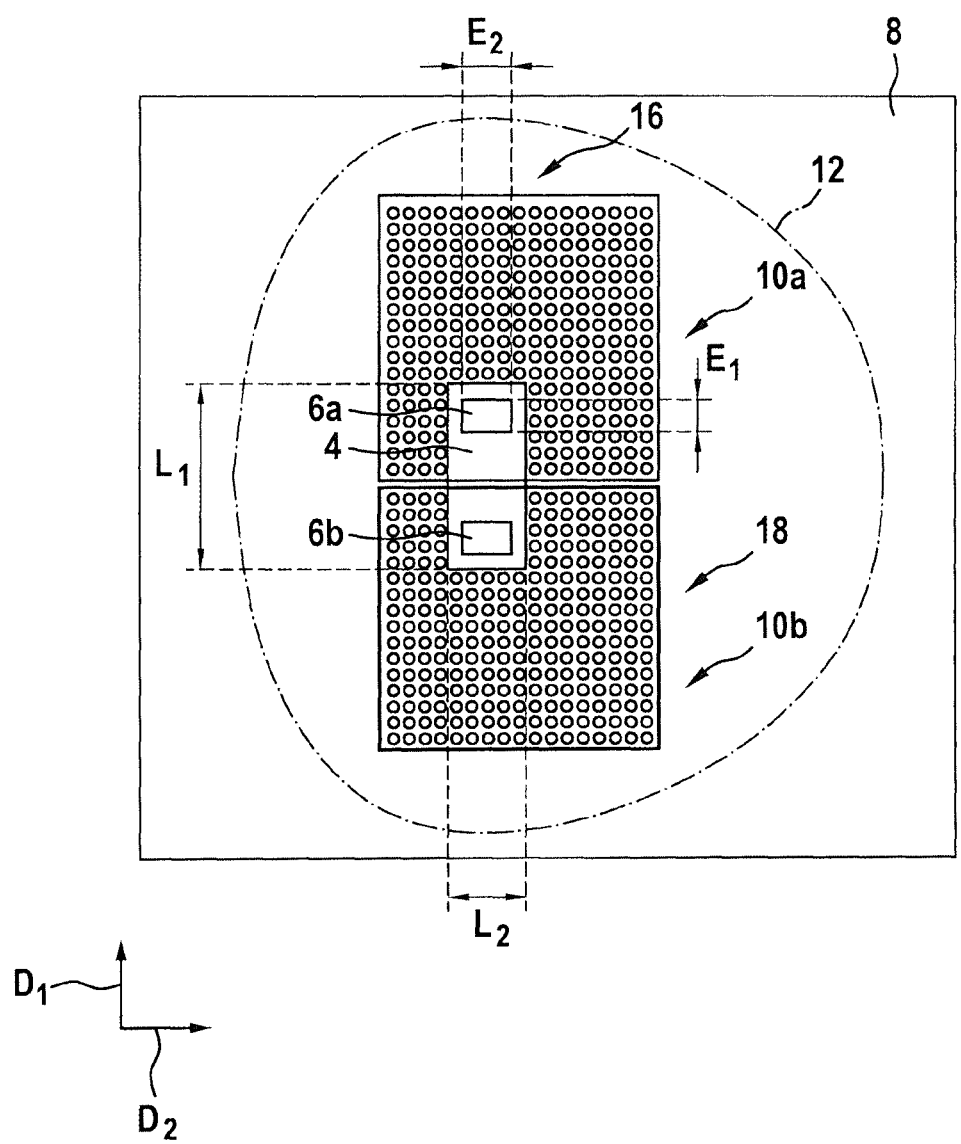
FIG. 7 depicts a schematic top view of a light source support of an exterior aircraft light according to another exemplary embodiment of the invention.
Figure 8:
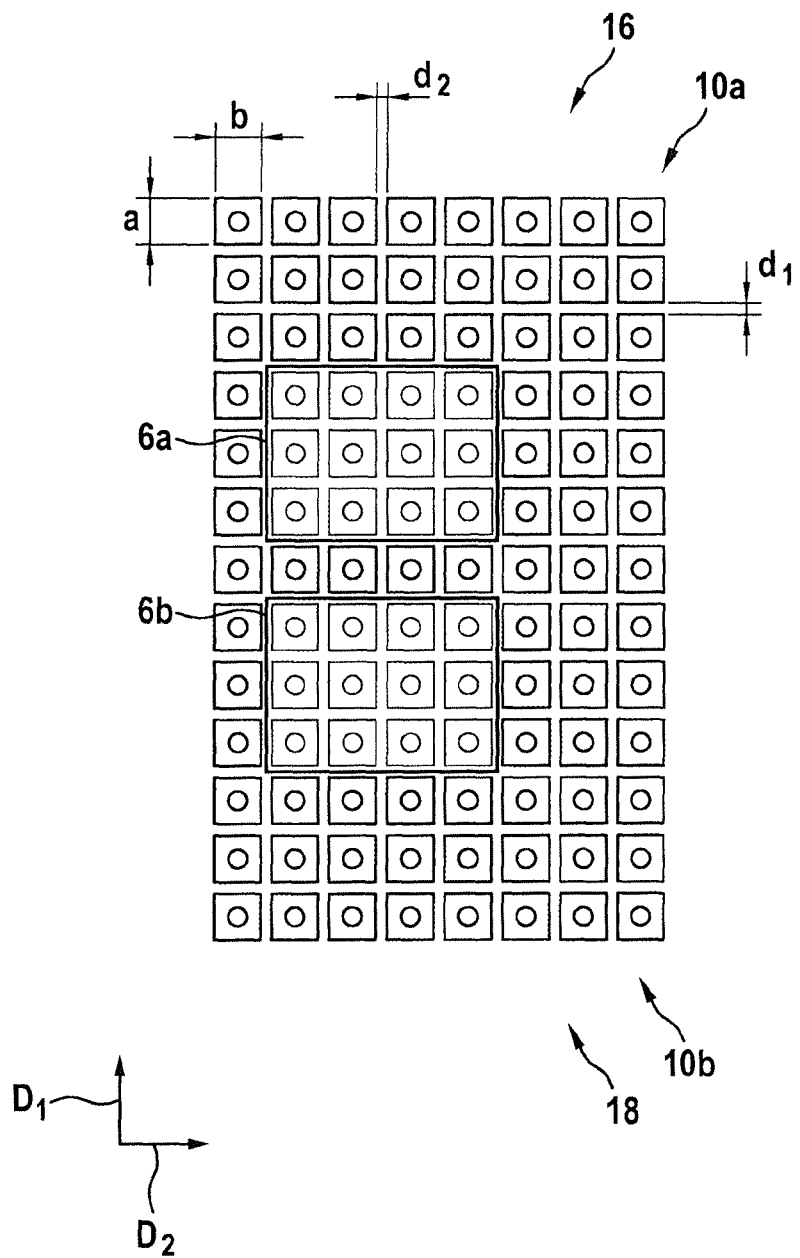
FIG. 8 depicts an enlarged detail of the light source support shown in FIG. 7.

FIG. 7 depicts a schematic top view of a light source support 8 of an exterior aircraft light 2 according to another exemplary embodiment of the invention, and FIG. 8 depicts an enlarged detail of the light source support 8 shown in FIG. 7.

In the exemplary embodiment depicted in FIGS. 7 and 8, the electric contact areas 10a, 10b are not provided as stripes having a longitudinal extension, as depicted in FIGS. 4A to 4C and 6A to 6C, but as dots having the same or nearly the same extensions in both directions D1, D2, extending parallel to the plane of the light source support 8.

In the exemplary embodiment depicted in FIGS. 7 and 8, the electric contact areas 10a, 10b are rectangular-shaped, in particular square-shaped. In further embodiments, which are not explicitly shown in the figures, the electric contact areas 10a, 10b may a have round shapes, in particular circular shapes.

The electric contact areas 10a, 10b are arranged in respective rectangular arrays of electric contact areas 10a, 10b. In particular, the electric contact areas 10a, 10b are arranged in respective two-dimensional matrix patterns.

The extensions a, b of each of the electric contact areas 10a, 10b in the plane of the light source support 8 may be in the range of between 0.1 mm and 0.3 mm, in particular in the range of between 0.1 mm and 0.2 mm.

The distances d1, d2 between adjacent electric contact areas 10a, 10b in the first and second directions D1, D2 may be the range of between 0.1 mm and 0.3 mm, in particular in the range of between 0.1 mm and 0.2 mm.

In alternative embodiments, the electric contact areas 10a, 10b may be arranged in different patterns.

Similar to the embodiments depicted in FIGS. 4A to 4C, 5A to 5C, 6A to 6C, the electric contact areas 10a, 10b of FIGS. 7 and 8 are provided as two groups 16, 18 of electric contact areas 10a, 10b. A first group 16 of electric contact areas 10a are shown in the upper halves of FIGS. 7 and 8. The electric contact areas 10a of the first group 16 are electrically connected with each other, for example by conductive traces formed within the light source support 8 and/or by conductive traces formed on a back side of the light source support 8. A second group 18 of electric contact areas 10b are shown in the lower halves of FIGS. 7 and 8. The electric contact areas 10b of the second group 18 are electrically connected with each other, for example by conductive traces formed within the light source support 8 and/or by conductive traces formed on a back side of the light source support 8.

The light source 4 is arranged on the light source support 8 in a position in which the first electrode 6a of the light source 4 contacts a plurality, for example twelve, of the electric contact areas 10a of the first group 16, and the second electrode 6b of the light source 4 contacts a plurality, for example twelve, of the electric contact areas 10b of the second group 18. The first and second electrodes 6a, 6b may in particular be soldered to the respective electric contact areas 10a, 10b, which may be provided as solder pads.

In further embodiments, which are not explicitly shown in the figures, the first and second electrodes 6a, 6b of the light source 4 may by coupled to different numbers of electric contact areas 10a, 10b. The first and second electrodes 6a, 6b may, in an extreme case, be coupled to only a single electric contact area 10a, 10b of each group 16, 18, respectively.

Similar to the embodiments depicted in FIGS. 4A to 4C, 5A to 5C, 6A to 6C, the electric contact areas 10a of the first group 16 are electrically connected with a first pole of an electric power supply (not shown), and the electric contact areas 10b of the second group 18 are electrically connected with a second pole of the electric power supply for operating the light source 4 by supplying electric power to the light source 4 via the electric contact areas 10a, 10b.

The exterior aircraft light 2 also comprises an optical element 12 for shaping a light output 14 of the exterior aircraft light 2 from the light, which is emitted by the light source 4. In the embodiment depicted in FIG. 7, the optical element 12 is a lens, which is arranged over the light source 4 and which is supported by the light source support 8, similar to the optical element 12 of the embodiment depicted in FIGS. 4A to 4C, 5A to 5C, 6A to 6C.

Similar to the embodiment depicted in FIGS. 4A to 4C, 5A to 5C, 6A to 6C, the light source 4 may be installed on the light source support 8 in different positions along the second direction. This may allow for adapting the light output 14, as emit-ted by the exterior aircraft light 2 in operation, to different mounting positions and/or mounting orientations of the exterior aircraft light 2 when mounted to the aircraft 100.

The extension of light source 4 along the first direction D1, in particular the distance between the electrodes 6a, 6b of the light source 4 along the first direction D1 is smaller than the combined extension of the first and second groups 16, 18 of electric contact areas 10a, 10b in the first direction D1.

The light source 4 may, for example, have an extension L1 of between 0.5 mm and 1.5 mm along the first direction D1, and the light source 4 may have an extension L2 of between 0.25 mm and 0.85 mm along the second direction D2.

Each of the electrodes 6a, 6b may, for example, have an extension E1 of between 0.25 mm and 0.5 mm along the first direction D1, and each of the electrodes 6a, 6b may have an extension E2 of between 0.1 mm and 0.5 mm along the second direction D2.

Since a light source support 8 according to the embodiment depicted in FIGS. 7 and 8 comprises a plurality of electric contact areas 10a, 10b in the first direction D1, different types of light sources 4, in particular light sources 4 having different extensions in the first direction D1, may be mounted to the light source support 8.

A light source support 8 according to an embodiment as it is depicted in FIGS. 7 and 8 may be conveniently combined with a plurality of different light sources 4. In other words, an exterior aircraft light 2 with a light source support 8 according to an embodiment as it is depicted in FIGS. 7 and 8 may comprise a light source 4 that may be selected from a wide variety of different types of light sources 4, in particular from a plurality of different types of light sources 4 having different dimensions.

An exterior aircraft light 2 according to an exemplary embodiment of the invention may also comprise a plurality of light sources. The plurality of light sources may be arranged next to each other on the first and second groups 16, 18 of electric con-tact areas 10a, 10b, as they are depicted in FIGS. 4A to 4C, 5A to 5C, 6A to 6C, 7, and 8. In such an embodiment, the plurality of light sources are electrically connected in parallel to each other via the first and second groups 16, 18 of electric contact areas 10a, 10b. The light that is emitted by the plurality of light sources may be shaped into a light output of the exterior aircraft light 2 by a common optical element 12, which extends over the first and second groups 16, 18 of electric contact areas 10a, 10b and over the plurality of light sources.

Figure 9:
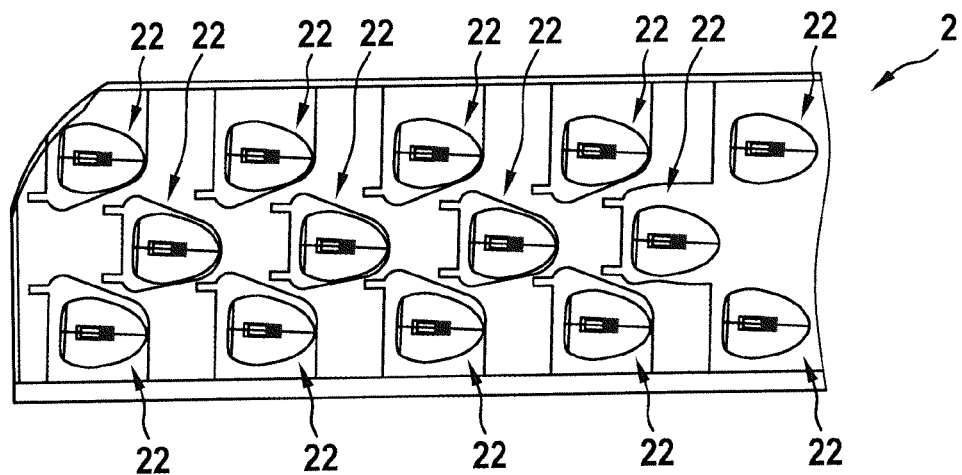
FIG. 9 depicts an exterior aircraft light according to another exemplary embodiment of the invention, the exterior aircraft light comprising a plurality of light sources and a plurality of optical elements.

FIG. 9 depicts an exterior aircraft light 2 according to another exemplary embodiment of the invention, comprising a plurality of light sources 4 and a plurality of optical elements 12, in a schematic top view.

In the embodiment depicted in FIG. 9, the exterior aircraft light 2 comprises a plurality of light modules 22, wherein each of the light modules 22 is implemented similar to the implementation depicted in FIGS. 4A to 4C, 5A to 5C, 6A to 6C. A single light module 22 is shown in FIG. 10.

Figure 10:
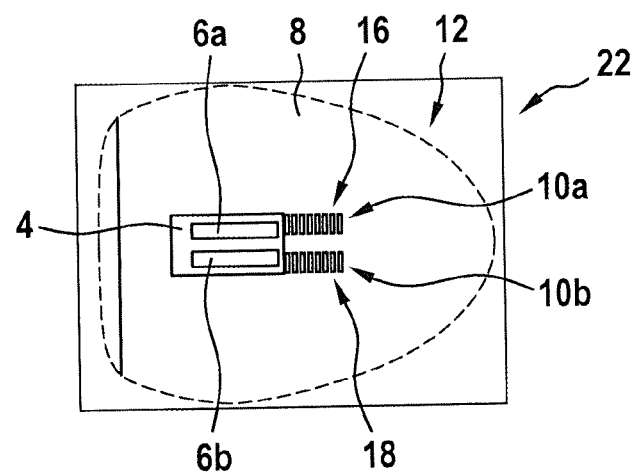
FIG. 10 depicts an enlarged detail of the exterior aircraft light shown in FIG. 9.

In the embodiment depicted in FIGS. 9 and 10, the exterior aircraft light 2 comprises a plurality of first and second groups 16, 18 of electric contact areas 10a, 10b. The electric contact areas 10a, 10b of each of the first groups 16 are spaced from each other and they are electrically connected with each other. The electric contact areas 10a, 10b of each of the second groups 18 are spaced from each other and are electrically connected with each other.

In the embodiment depicted in FIG. 9, the first and second groups 16, 18 of electric contact areas 10a, 10b are arranged in pairs, with each pair comprising a first group 16 and a second group 18 of electric contact areas 10a, 10b, respectively.

A light source 4 is mounted to the electric contact areas 10a, 10b of each pair. A first electrode 6a of each light source 4 is connected, in particularly soldered, to at least one electric contact area 10a of the first group 16 of the respective pair, and a second electrode 6b of each light source 4 is connected, in particularly soldered, to at least one contact area 10b of the second group 18 of the respective pair.

In the embodiment depicted in FIGS. 9 and 10, an optical element 12, in particular a lens, is assigned to each pair of first and second groups 16, 18 of electric contact areas 10a, 10b, respectively.

In alternative embodiments, which are not explicitly shown in the figures, a common optical element 12 may be assigned to a plurality of pairs of first and second groups 16, 18 of electric contact areas 10a, 10b. The exterior aircraft light 2 may, in particular, comprise only a single optical element 12, which generates the light out-put emitted by the exterior aircraft light 2 from the light outputs provided by all light sources 4 of the exterior aircraft light 2.

The light output, as emitted by an exterior aircraft light 2 comprising a plurality of light sources 4, as it is depicted in FIG. 9, may be set by setting the position of each of the plurality of light sources 4 on the respective pair of first and second groups 16, 18 of electric contact areas 10a, 10b, as it has been described for a single light source 4 with respect to FIGS. 4A to 4C, 5A to 5C, 6A to 6C, 7, and 8.

By employing a plurality of light sources 4 in an exterior aircraft light 2, as it is depicted in FIG. 9, the total light output emitted by the exterior aircraft light 2 may be increased compared to an exterior aircraft light 2 comprising only a single light source 4. In other words, the intensity of the light output may be increased by providing a plurality of light modules 22 of the same design. It is also possible to provide light modules 22 of different designs. In particular, it is possible to provide different light modules for different lighting functionalities. In this way, a multi-function exterior aircraft light may be conveniently adapted to different aircraft types/different mounting positions and/or orientations.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed, but that the invention will include all embodiments falling within the scope of the appended claims.

What is claimed is:

1. An exterior aircraft light, comprising:
    a light source having a first electrode and a second electrode;
    a light source support for supporting the light source; and
    at least one optical element that is arranged over the light source for shaping a light output of the exterior aircraft light,
    wherein the light source support comprises conductive traces for supplying electric energy to the light source,
    wherein the light source support comprises a first group of electric contact areas, which are spaced from each other and which are electrically connected with each other, and a second group of electric contact areas, which are spaced from each other and which are electrically connected with each other,
    wherein the first group of electric contact areas and the second group of electric contact areas form an extended electric contact structure that allows for the light source to be positioned on the light source support in a plurality of different positions,
    wherein the first electrode of the light source is soldered to a subset of the first group of electric contact areas and wherein the second electrode of the light source is soldered to a subset of the second group of electric contact areas, wherein light from the light source contributes differently to the light output of the exterior aircraft light for the plurality of different positions on the light source support, the exterior aircraft light is a wing-mounted forward navigation light, the light output of the forward navigation light has a cut-off angle (γ) with respect to the light source support, and a first cut-off angle (γ), present when the light source is arranged at a first end region of the first and second groups of electric contact areas, differs from a second cut-off angle (γ), present when the light source is arranged at a second end region of the first and second groups of electric contact areas.

2. The exterior aircraft light according to claim 1,
wherein the electric contact areas of the first group are arranged in a first row of electric contact areas; and
wherein the electric contact areas of the second group are arranged in a second row of electric contact areas.

3. The exterior aircraft light according to claim 2, wherein the first row of electric contact areas and the second row of electric contact areas are arranged side-by-side.

4. The exterior aircraft light according to claim 1,
wherein the electric contact areas of the first group are arranged in a first two-dimensional matrix pattern of electric contact areas; and
wherein the electric contact areas of the second group are arranged in a second two-dimensional matrix pattern of electric contact areas.

5. The exterior aircraft light according to claim 4, wherein the first two-dimensional matrix pattern of electric contact areas and the second two-dimensional matrix pattern of electric contact areas are arranged side-by-side.

6. The exterior aircraft light according to claim 1,
wherein at least one of the first group of electric contact areas or the second group of electric contact areas are stripe-shaped.

7. The exterior aircraft light according to claim 1, wherein the electric contact areas of the first group and the electric contact areas of the second group are provided as solder pads.

8. The exterior aircraft light according to claim 1,
wherein the electric contact areas of the first group and the electric contact areas of the second group have in at least one direction an extension (a, b) in the range of between 0.1 mm and 0.3 mm; and/or
wherein adjacent electric contact areas of the first group and adjacent electric contact areas of the second group are spaced by a distance (d) of between 0.1 mm and 0.3 mm.

9. The exterior aircraft light according to claim 1,
wherein the electric contact areas of the first group are electrically connected with each other within the light source support or on a back side of the light source support; and/or
wherein electric contact areas of the second group are electrically connected with each other within the light source support or on the back side of the light source support.

10. The exterior aircraft light according to claim 1,
wherein the light output of the exterior aircraft light has a main light emission direction; and
wherein a first angle between the main light emission direction and the light source support, measured when the light source is arranged at a first end region of the first and second groups of electric contact areas, differs from a second angle between the main light emission direction and the light source support, measured when the light source is arranged at a second end region of the first and second groups of electric contact areas, by between 20° and 30°.

11. The exterior aircraft light according to claim 1,
wherein the first cut-off angle (γ) differs from the second cut-off angle (γ) by between 20° and 30°.

12. An aircraft, such as an airplane or a rotorcraft, comprising the at least one exterior aircraft light according to claim 1.

13. The exterior aircraft light according to claim 1, wherein at least one of the first group of electric contact areas or the second group of electric contact areas are parallel stripes.

14. The exterior aircraft light according to claim 1, wherein at least one of the first group of electric contact areas or the second group of electric contact areas are square-shaped or circular.

15. An exterior aircraft light, comprising:
a plurality of light sources, each having a respective first electrode and a respective second electrode;
at least one optical element that is arranged over the plurality of light sources for shaping a light output of the exterior aircraft light; and
a plurality of first groups of electric contact areas, wherein the electric contact areas of each first group are spaced from each other and are electrically connected with each other, and a plurality of second groups of electric contact areas, wherein the electric contact areas of each second group are spaced from each other and are electrically connected with each other,
wherein a respective first group of electric contact areas and a respective second group of electric contact areas form a respective extended electric contact structure that allows for a respective light source to be positioned on a light source support in a plurality of different positions,
wherein the first electrode of the respective light source is soldered to a respective subset of the respective first group of electric contact areas and wherein the second electrode of the respective light source is soldered to a respective subset of the respective second group of electric contact areas,
wherein light from the plurality of light sources contributes differently to the light output of the exterior aircraft light for the plurality of different positions on the light source support,
the exterior aircraft light is a wing-mounted forward navigation light,
the light output of the forward navigation light has a cut-off angle (γ) with respect to the light source support, and
a first cut-off angle (γ), present when the respective light source is arranged at a first end region of the respective first and second groups of electric contact areas, differs from a second cut-off angle (γ), present when the respective light source is arranged at a second end region of the respective first and second groups of electric contact areas.

16. The exterior aircraft light according to claim 15, wherein the first cut-off angle (γ) differs from the second cut-off angle (γ) by between 20° and 30°.

17. A method of assembling an exterior aircraft light, comprising:
providing a light source having a first electrode and a second electrode;

providing a light source support for supporting the light source, wherein the light source support comprises a first group of electric contact areas, which are spaced from each other and which are electrically connected with each other, and a second group of electric contact areas, which are spaced from each other and which are electrically connected with each other, wherein the first group of electric contact areas and the second group of electric contact areas form an extended electric contact structure; and soldering the first electrode of the light source to a subset of the first group of electric contact areas and soldering the second electrode of the light source to a subset of the second group of electric contact areas, thus fixing the light source to the light source support at a selected position, wherein the exterior aircraft light is a wing-mounted forward navigation light and wherein the method comprises:

determining a wing angle ($\alpha 1$, $\alpha 2$) of an aircraft wing with respect to an aircraft fuselage; selecting the position of the light source on the light source support depending on the determined wing angle ($\alpha 1$, $\alpha 2$).

* * * * *